United States Patent

[11] 3,607,240

[72] Inventors Alfred Kunert;
Gerhard Oesterhelt, both of Nurnberg, Germany
[21] Appl. No. 843,976
[22] Filed July 23, 1969
[45] Patented Sept. 21, 1971
[73] Assignee Siemens Aktiengesellschaft
Berlin, Germany
[32] Priority July 24, 1968
[33] Germany
[31] P 17 58 701.8

[54] SOLDER FOR CONTACTING A SEMICONDUCTOR BODY AND METHOD FOR ITS PRODUCTION
16 Claims, 2 Drawing Figs.

[52] U.S. Cl. .......... 75/134 N, 75/134 S, 75/134 R, 75/170, 75/172, 136/237, 29/504, 75/135
[51] Int. Cl. .......... C22c 5/00, B23k 1/04, H01v 1/00
[50] Field of Search .......... 75/172, 134.10, 170, 134 F, 134 N, 134 R; 136/237; 29/504

[56] References Cited

UNITED STATES PATENTS

| | | | |
|---|---|---|---|
| 1,647,301 | 11/1927 | Ledig .......... | 75/172 |
| 2,900,251 | 8/1959 | Evans et al. .......... | 75/134 X |
| 3,070,875 | 1/1963 | Feduska .......... | 75/172 X |
| 3,220,828 | 11/1965 | Kaarlela .......... | 75/134 |
| 3,297,436 | 1/1967 | Duwez .......... | 75/134 |
| 3,470,033 | 9/1969 | Oesterhelt et al. .......... | 136/237 |

FOREIGN PATENTS

| | | | |
|---|---|---|---|
| 193,050 | 9/1923 | Great Britain .......... | 75/172 |

*Primary Examiner*—Henry W. Tarring, II
*Attorneys*—Curt M. Avery, Arthur E. Wilfond, Herbert L. Lerner and Daniel J. Tick

ABSTRACT: A solder for contacting a semiconductor body with a contact piece, whereby silicon constitutes an alloying component of the semiconductor body. The solder composition is:

$$Pd_x((Me'_y Me''_{1-y})_z Si_{1-z})_{1-x}$$

with $0.25 \leq x \leq 0.60$
$0.20 \leq y \leq 0.90$
$0.05 \leq z \leq 0.35$ wherein Me' is molybdenum or tungsten and Me'' is iron, nickel, or cobalt.

SOLDER FOR CONTACTING A SEMICONDUCTOR BODY AND METHOD FOR ITS PRODUCTION

The invention relates to a solder for contacting a semiconductor body with a contact piece, whereby silicon constitutes an alloying component of the semiconductor body, as well as to the method of the production of the solder. More particularly, the invention relates to a solder for contacting a thermoelement leg with a contact bridge.

The contacting of semiconductor bodies with contact pieces, through which electrical energy can be fed into or tapped from the semiconductor body, is frequently subjected to variable stresses. The contacting must, therefore, possess high mechanical stability and resistance to high temperature and temperature changes.

Particularly during the construction of thermogenerators of p- and n-conducting thermoelement legs which are provided with an electricity-conducting connection, by means of contact bridges, certain demands must be placed upon the contacting of thermoelement legs with the contact bridges, since operational temperatures on the hot side of the thermogenerator might be very high. The contacting must be mechanically stable and strong. The expansion coefficient of the material of the contact zone must coincide, to a large degree, with the expansion coefficients of the leg material and the bridge material respectively. Furthermore, the contact zone must have the slightest possible thermal and electrical resistance, since the efficiency of a thermogenerator depends upon these factors among others.

It is known to fuse the thermoelement legs, in a high frequency field, upon the contact bridges. This however, may result in a dissociation of the alloying components of the electrically active semiconductor materials of the thermoelement legs. The resultant inhomogeneities of the semiconductor alloy which alter the specific resistance, and which usually result in a reduction in the heat resistance, are associated with a reduction in the effectiveness of the leg material. Moreover, the doping of the semiconductor material, which has a thermoelectric action, can change during the melting process. This, too, leads to a reduced effectiveness. This diminished effectiveness entails a reduction in the efficiency of the thermogenerator. It should also be mentioned that during the melting process, materials of opposite conductivity may contact each other in the contact region, e.g. when an n-conducting thermoelement leg is fused onto a contact bridge comprised of highly doped, p-conducting silicon. The charge carriers are thereby compensated in the contact region. The latter appears, therefore, undoped and increases the inner resistance and strongly diminishes the effectiveness of the components. This effect may even produce p-n barrier or blocking layers, thus interrupting the current path. Furthermore, a homogeneous contact cannot be expected over the entire contact region, during the melting process, between the thermoelement leg and the contact bridge. The high frequency field attacks from the outside. In the worst cases this produces uncontacted localities in the interior of the contact region, which results in a corresponding reduction of the effectiveness.

It is also known to solder the thermoelement legs upon the contact bridges. The solders used, thereby, must be adjusted to the leg material and to the material of the contact bridges. It is known to contact thermoelement legs, comprised of a germanium/silicon alloy by using a solder, which is comprised of doped or undoped germanium and silicon and where, due to a higher germanium contact, the liquid temperature of the solder is below the solid temperature of the thermoelectrically active semiconductor alloy. The use of this solder, to a large extent, ensures that the doping of the thermoelement leg does not change and that the alloying material of the thermoelement leg does not decompose. However, thermogenerators require, at their hot sides, temperature of approximately 1,000° C., in order to obtain a high efficiency. At such high operational temperatures, the germanium share of the germanium-silicon solder will oxidize. This will considerably change the mechanical properties of the contact region. Thermogenerators, which are contacted with germanium-silicon solders, will thus be unsafe to operate at such high temperatures and will be maintenance free. Moreover, due to its brittleness, it is preferable to apply germanium-silicon solder in powder form only upon the contacting locations of the thermoelement leg and upon the contact bridge, in order to avoid further time-wasting processing.

The task at hand is to form, during the contacting of the previously mentioned semiconductor bodies, by means of a contacting piece a contact zone whose expansion coefficient is adjusted to the semiconductor material and to the material of the contact piece. Electrical and thermal conductivity of the contact region must be as high as possible and the contact zone must be oxidation resistant. Moreover, the solder must not produce any dissociation or change in the doping of the semiconductor material. The solder must produce a durable, tension-free and mechanically stable connection.

According to the invention this problem can be solved with a solder having the following composition:

$$Pd_x((Me'_y Me''_{11y})_z Si_{11z})_{11x}$$

with $$0.25 \leq x \leq 0.60$$
$$0.20 \leq y \leq 0.90$$
$$0.05 \leq z \leq 0.35$$

and Me' constitutes molybdenum or tungsten and Me'' constitutes iron, nickel or cobalt.

The solder of the invention complies with the requirements set forth. The share of palladium reduces the liquid temperature of the solders below the solid temperature of the semiconductor bodies. A portion of the palladium forms with the silicon an eutectic whose liquid temperatures range between 700° and 1,000° C. Above all, these eutectics ensure a good wettability with the materials to be soldered. During the bonding with the semiconductor material and with the material of the contact piece, this configuration is altered and the solid temperature of the contact region rises. In the fully contacted component, the contact region possesses a solidus temperature of over 1,000° C. Thus, hot-side temperature of about 1,000° C. can be realized in a thermogenerator, guaranteeing a high effectiveness. Moreover, due to the palladium share of the solder, the contact is resistant to oxidation and to corrosion and its thermal and electrical conductance is better than that of the semiconductor material. The dimetal component Me'Me'' is responsible for the fact, that the contact zone and also the contacting is extremely mechanically stable.

The contact possesses great hardness and great breaking resistance. It should be emphasized that high resistance to heat and to temperature changes are obtained, since the expansion coefficient of the solder can be adjusted to the expansion coefficient of the semiconductor material and above all to the expansion coefficient of the material of the contact piece. Moreover, no change in the doping of the semiconductor material of the thermoelement legs occurs, during contacting, since the alloyed on metals do not coat or do so only very lightly. Also, the solder acts, somewhat, in the manner of a "-diffusion stopper" and prevents the compensation of load carriers in the contact regions, where opposite doping regions bump into one another.

The mixing ratio of the solder components Me' and Me'' can correspond, at least approximately to an eutectic or diseutectic point in the melt diagram.

A preferred solder composition for contacting a GeSi-semiconductor body is:

$Pd_{0.3}((Mo_{0.37}Fe_{0.63})_{0.1}Si_{0.9})_{0.7}$
$Pd_{0.38}((W_{0.46}Co_{0.54})_{0.1}SI_{0.9})_{0.62}$
$Pd_{0.44}((W_{0.6}CO_{0.4})_{0.12}Si_{0.88})_{0.56}$
$Pd_{0.55}((W_{0.75}Co_{0.25})_{0.2}Si_{0.8})_{0.45}$
$Pd_{0.38}((W_{0.5}Ni_{0.5})_{0.1}Si_{0.9})_{0.62}$
$Pd_{0.38}((Mo_{0.46}Co_{0.54})_{0.1}Si_{0.9})_{0.62}$
$Pd_{0.44}((Mo_{0.6}Co_{0.4})_{0.1}Si_{0.9})_{0.56}$
$Pd_{0.35}((Mo_{0.75}Co_{0.25})_{0.18}Si_{0.82})_{0.65}$
$Pd_{0.3}((Mo_{0.67}Ni_{0.33})_{0.13}Si_{0.87})_{0.7}$

In a preferred production method for a solder according to the present invention, the metals Me′ and Me″ are fused in an appropriate mixing ratio. The dimetal alloy is thereafter molten, at least once, with silicon, at an appropriate mixing ratio and the respective palladium share is added, during a final melting.

The advantage of the aforedescribed production method is in the melting of the dimetal alloy Me′/Me″. Generally, the melting point of the dimetal alloy is always considerably less than the highest melting point of the respective metal Me′ or Me″. The melting point of the dimetal alloys is therefore, usually, close to the melting point of the silicon. As a result, the silicon component will not escape during the fusion process. Therefore, the solders of the present invention afford an exact adjustment of the expansion coefficient of the solders to the expansion coefficient of the contact piece material and the semiconductor body, without entailing particular difficulties in the production process. The repeated melting of the dimetal component with the silicon and the palladium causes the solder to homogenize, which influences primarily the magnitude of the electrical and the thermal conductivity, which is optimized through said homogenization. In this respect, the adjustment of the expansion coefficient of the solders is further promoted, insofar as the four components offer great variation opportunities in regard to the mixing ratio.

It is preferable to produce the solder of the present invention by placing the dimetal alloy and the silicon or the silicon and the palladium into a vertically positioned, bottom sealed melting tube and to melt inductively the material with the aid of an HF field and to set the melting tube in rotation around the tubular axis. The melting tube can be lowered from the HF field, in the direction of the melt, during solidification. This centrifugal method, ensures a good homogenization of the solder.

The invention will be disclosed in greater detail in the examples, with reference to FIGS. 1 and 2, in which.

Figures 1, 2:
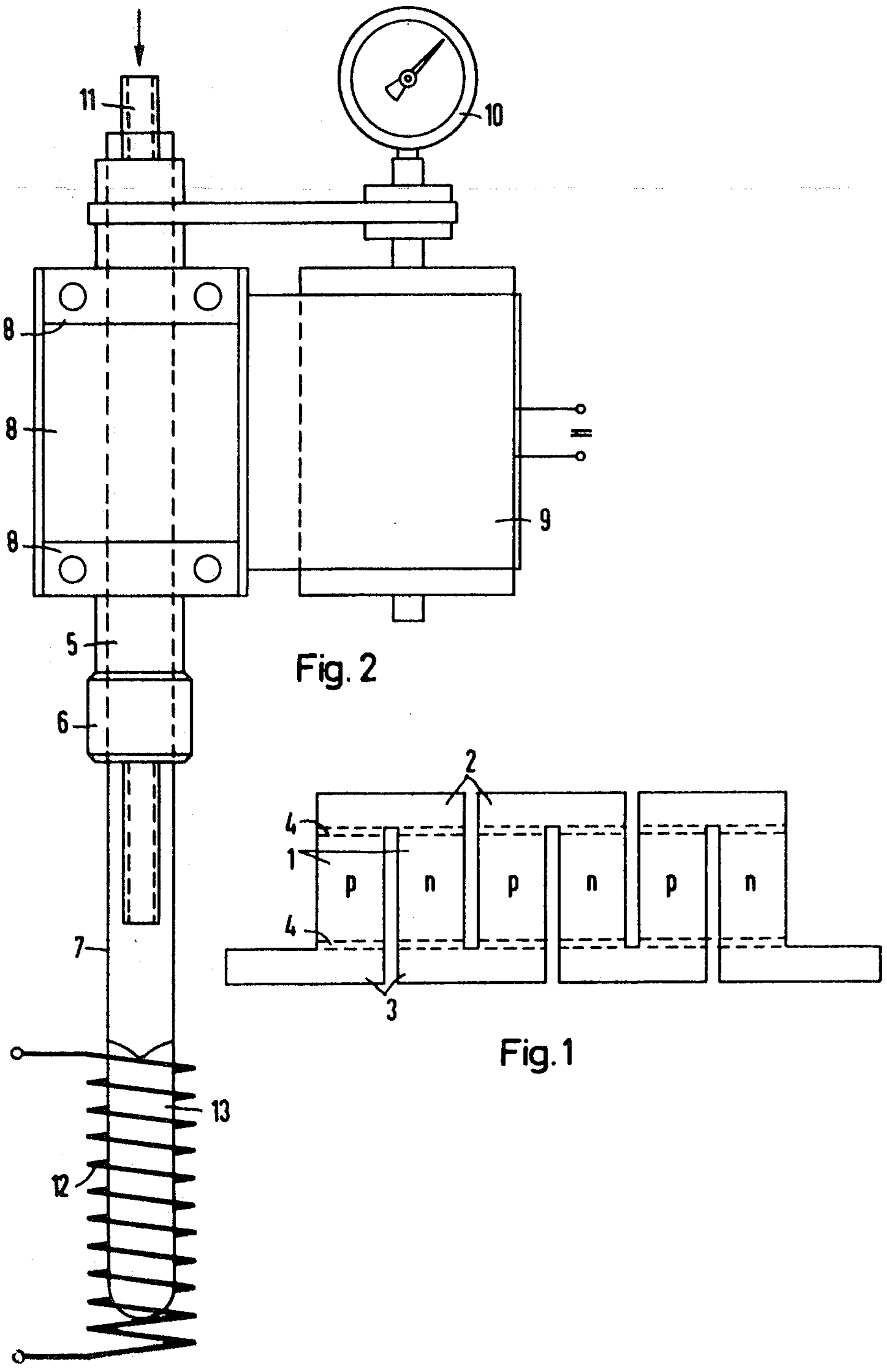
FIG. 1 shows a thermogenerator.
FIG. 2 shows a device for making the solder.

In FIG. 1 p- and n-conducting thermoelement legs 1 are so connected through contact bridges 2 or 3 in a thermogenerator that the legs are in electrical series and in thermal parallel. The thermoelement legs 1 are contacted on the contact bridges 2 and 3 by the solder of the present invention, so that contact zones 4 occur. The thermoelement legs are produced of a germanium-silicon alloy with 30 atom-% germanium, and the remainder being silicon, ironsilicide ($FeSi_2$) or manganesesilicide. In the germanium-silicon alloy, the p-conducting legs are doped with boron, gallium or indium, and the n-conducting legs are doped with phosphorus, arsenic or antimony. The material for the contact bridges 2 and 3 is preferably an alloy of silicon and two metals, whereby it is preferable to choose a combination for the contact bridge material which, at least, almost corresponds to the alloy component $(Me'_y\,Me''_{1-y})_z\,Si_{1-z}$. Contact bridge material of the aforementioned type has great advantages when used in thermogenerators. A solder combination which approximates, at least closely, the combination of the contact bridge material ensures a continuous junction in the contact region 4 from the contact bridge 2 or 3 to the thermoelement leg 1, and the differences in the expansion coefficients between the contact bridge material and the semiconductor alloy, which are slight, to begin with, are compensated along the entire required temperature range. The aforementioned good qualities of the contact region 4 are further increased through this fact and an optimum strength construction as well as a maximum effectiveness are obtained for the thermogenerator. Listed below are contact bridge materials, whose composition approximates the aforementioned solder compositions, whereby the sequence corresponds to the sequence of the listed solder combinations.

$(Mo_{0.37}\,Fe_{0.63})_{0.1}\,Si_{0.9}$
$(W_{0.46}\,Co_{0.54})_{0.1}\,Si_{0.9}$
$(W_{0.67}\,Co_{0.33})_{0.14}\,Si_{0.86}$
$(W_{0.75}\,Co_{0.25})_{0.2}\,Si_{0.8}$
$(W_{0.51}\,Ni_{0.49})_{0.1}\,Si_{0.9}$
$(Mo_{0.46}\,Co_{0.54})_{0.1}\,Si_{0.9}$
$(Mo_{0.67}\,Co_{0.33})_{0.12}\,Si_{0.88}$
$(Mo_{0.75}\,Co_{0.25})_{0.18}\,Si_{0.82}$
$(Mo_{0.7}\,Ni_{0.3})_{0.17}\,Si_{0.83}$

To contact the thermoelement leg 1 with the contact bridges 3 or 2, one of the solders according to the invention is placed upon the front faces of the thermoelement legs 1 or upon the contact bridges 2 and 3, at a required amount. Subsequently, the solder is ground down to foil thickness and the thermoelement legs 1 and contact bridges 2 or 3 are soldered together. This method of production guarantees a uniformly thin solder layer across the entire surface of contact region 4. Hence, the contact region 4 has the same defined combination for each contact in the thermogenerator and the qualities of the thermogenerator remain virtually unchanged with respect to the individual pairs of thermoelement legs. The grinding or polishing of the solder layer is improved by the metallic components of the solder.

FIG. 2 shows a device for making the solder. The device comprises two parts, one of which serves for the rotation process, while the other serves to heat the charge. The rotation device contains a rotating clamping tube 5 with a locking nut 6, whereinto the melting tube 7, comprised, e.g. of quartz, can be inserted and centrally clamped. The melting tube 7 can be provided with an additional cooling, e.g. with the aid of an air current. The clamping tube 5 is guided through ball bearings 8, which are held in a metal box and can be driven with a variable speed motor 9. A speed indicator 10 can be provided for the control of the r.p.m. of the melting tube. The clamping tube 5 contains another tube 11, through which argon is introduced, e.g. in order to create an inert atmosphere. The heating part consists of a high frequency induction coil 12, which is energized by a high frequency generator. Each individual casting is prepared by weighing in the appropriate amount of alloying components. Either silicon alone, or silicon and palladium can be weighed in, together with the dimetal alloy, at an appropriate mixing ratio. The original material, which is already well mixed, is placed into the melting tube 7 and melted by the high frequency field. It is preferable to let the melting tube 7 rotate, even during the melting, so as to ensure a good mixing of the alloy.

FIG. 2 does not show that a shaking movement of the melting tube 7 can be provided which would further improve the homogeneity of the melt 13. Following the melting, rotation is continued during the solidification and the melting tube 7 is lowered form the induction coil 12, in the direction of its tubular axis. Thus, for example, an alloy of $(Mo_{0.75}\,Co_{0.25})_{0.2}\,Si_{0.8}$ can be obtained tear-free, in a melting tube 7, having an inside diameter of 12 to 13 mm., at a speed of 400 to 800 r.p.m. The other solders are analogously prepared.

We claim:

1. A solder for contacting a semiconductor body with a contact piece, whereby silicon constitutes an alloying component of the semiconductor body, which comprises:

$Pd_x\,((Me'_y\,Me''_{1-z})_z\,Si_{1-z})_{1-x}$ with $0.25 \leq x \leq 0.60$
$0.20 \leq y \leq 0.90$
$0.05 \leq z \leq 0.35$ and Me′ constitutes molybdenum or tungsten and Me″ is iron, nickel or cobalt.

2. The solder of claim 1, wherein the mixing ratio of the solder components Me′ and Me″ corresponds, at least approximately, to an eutectic or dystectic point of the melt diagram.

3. The solder of claim 2, whereby the solder used to contact a GeSi semiconductor body, has the composition:

$Pd_{0.3}\,((Mo_{0.37}\,Fe_{0.63})_{0.1}\,Si_{0.9})_{0.7}$.

4. The solder of claim 2, whereby the solder used to contact a GeSi semiconductor body, has the composition:

$Pd_{0.38}\,((W_{0.46}\,Co_{0.54})_{0.1}\,Si_{0.9})_{0.62}$.

5. The solder of claim 2, whereby the solder used to contact a GeSi semiconductor body, has the composition:

$Pd_{0.44}\,((W_{0.6}\,Co_{0.4})_{0.12}\,Si_{0.88})_{0.56}$.

6. The solder of claim 2, whereby the solder used to contact a GeSi semiconductor body, has the composition:

$Pd_{0.55}((W_{0.75}Co_{0.25})_{0.2}Si_{0.8})_{0.45}$.

7. The solder of claim 2, whereby the solder used to contact a GeSi semiconductor body, has the composition:

$Pd_{0.38}((W_{0.5}Ni_{0.5})_{0.1}Si_{0.9})_{0.62}$.

8. The solder of claim 2, whereby the solder used to contact a GeSi semiconductor body, has the composition:

$Pd_{0.38}((Mo_{0.46}Co_{0.54})_{0.1}Si_{0.9})_{0.62}$.

9. The solder of claim 2, whereby the solder used to contact a GeSi semiconductor body, has the composition:

$Pd_{0.44}((Mo_{0.6}Co_{0.4})_{0.1}Si_{0.9})_{0.56}$.

10. The solder of claim 2, whereby the solder used to contact a GeSi semiconductor body, has the composition:

$Pd_{0.35}((Mo_{0.75}Co_{0.25})_{0.18}Si_{0.82})_{0.65}$.

11. The solder of claim 2, whereby the solder used to contact a GeSi semiconductor body, has the composition:

$Pd_{0.3}((Mo_{0.67}Ni_{0.33})_{0.13}Si_{0.87})_{0.7}$.

12. The method of producing a solder of claim 1 which comprises melting together the metals $Me'$ and $Me''$ in an appropriate mixing ratio, subsequently melting the dimetal alloy and silicon, at least once, in an appropriate mixing ratio and during the last melting process adding the respective share of palladium.

13. The method of claim 12, wherein the dimetal alloy and the silicon are placed into a perpendicularly positioned melting tube, which is sealed at the bottom, and inductively melted with a high frequency field and the melting tube is rotated around the tubular axis.

14. The method of claim 13, wherein during the solidification of the melt, the melting tube is lowered from the high frequency field, in the direction of the tubular axis.

15. The method of claim 12, wherein the dimetal alloy and silicon and the palladium are placed into a perpendicularly positioned melting tube, which is sealed at the bottom, and inductively melted with a high frequency field and the melting tube is rotated around the tubular axis.

16. The method of claim 15, wherein during the solidification of the melt, the melting tube is lowered from the high frequency field, in the direction of the tubular axis.